United States Patent
Bae et al.

(10) Patent No.: US 9,312,122 B2
(45) Date of Patent: Apr. 12, 2016

(54) RINSE LIQUID FOR INSULATING FILM AND METHOD OF RINSING INSULATING FILM

(71) Applicants: Jin-Hee Bae, Uiwang-si (KR); Han-Song Lee, Uiwang-si (KR); Wan-Hee Lim, Uiwang-si (KR); Go-Un Kim, Uiwang-si (KR); Taek-Soo Kwak, Uiwang-si (KR); Bo-Sun Kim, Uiwang-si (KR); Sang-Kyun Kim, Uiwang-si (KR); Yoong-Hee Na, Uiwang-si (KR); Eun-Su Park, Uiwang-si (KR); Jin-Woo Seo, Uiwang-si (KR); Hyun-Ji Song, Uiwang-si (KR); Youn-Jin Cho, Uiwang-si (KR); Kwen-Woo Han, Uiwang-si (KR); Byeong-Gyu Hwang, Uiwang-si (KR)

(72) Inventors: Jin-Hee Bae, Uiwang-si (KR); Han-Song Lee, Uiwang-si (KR); Wan-Hee Lim, Uiwang-si (KR); Go-Un Kim, Uiwang-si (KR); Taek-Soo Kwak, Uiwang-si (KR); Bo-Sun Kim, Uiwang-si (KR); Sang-Kyun Kim, Uiwang-si (KR); Yoong-Hee Na, Uiwang-si (KR); Eun-Su Park, Uiwang-si (KR); Jin-Woo Seo, Uiwang-si (KR); Hyun-Ji Song, Uiwang-si (KR); Youn-Jin Cho, Uiwang-si (KR); Kwen-Woo Han, Uiwang-si (KR); Byeong-Gyu Hwang, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/090,003

(22) Filed: Nov. 26, 2013

(65) Prior Publication Data
US 2014/0315367 A1 Oct. 23, 2014

(30) Foreign Application Priority Data
Apr. 18, 2013 (KR) .......................... 10-2013-0043079

(51) Int. Cl.
H01L 21/02 (2006.01)
C11D 11/00 (2006.01)
(Continued)

(52) U.S. Cl.
CPC .......... *H01L 21/0206* (2013.01); *C11D 7/5022* (2013.01); *C11D 11/0047* (2013.01);
(Continued)

(58) Field of Classification Search
CPC .................................................. C11D 11/0047
USPC .................................................. 510/175, 176
See application file for complete search history.

(56) References Cited

U.S. PATENT DOCUMENTS 4,973,420 A * 11/1990 Van De Mark ............... 510/206
5,612,303 A * 3/1997 Takayanagi et al. .......... 510/174
(Continued)

FOREIGN PATENT DOCUMENTS

JP 2006-216704 A 8/2006
KR 10-2004-0068989 A 8/2004
(Continued)

OTHER PUBLICATIONS

Science Lab.Com, Material Safety Data Sheet for Ethyl Benzoate, Oct. 9, 2005, Science Lab.Com (5 pages).*
(Continued)

*Primary Examiner* — Gregory Webb
(74) *Attorney, Agent, or Firm* — Lee & Morse, P.C.

(57) ABSTRACT

A rinse liquid for an insulation layer, the rinse liquid including a solvent represented by the following Chemical Formula 1:

[Chemical Formula 1]

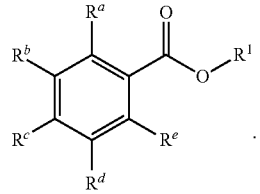

11 Claims, 1 Drawing Sheet

(51) Int. Cl.
*C11D 7/50* (2006.01)
*H01L 27/108* (2006.01)
*H01L 49/02* (2006.01)
*C11D 7/26* (2006.01)

(52) U.S. Cl.
CPC ...... *H01L21/0209* (2013.01); *H01L 21/02087* (2013.01); *H01L 21/02164* (2013.01); *H01L 21/02214* (2013.01); *H01L 21/02222* (2013.01); *H01L 21/02282* (2013.01); *H01L 21/02326* (2013.01); *C11D 7/266* (2013.01); *H01L 27/1085* (2013.01); *H01L 28/40* (2013.01)

(56) References Cited

U.S. PATENT DOCUMENTS

| | | | |
|---|---|---|---|
| 5,725,679 A | * | 3/1998 | Kitazawa et al. ............... 134/10 |
| 5,853,489 A | * | 12/1998 | Kitazawa ............................ 134/1 |
| 6,294,257 B1 | * | 9/2001 | Tsukakoshi et al. .......... 428/400 |
| 8,058,711 B2 | | 11/2011 | Lim et al. |
| 2008/0102211 A1 | | 5/2008 | Matsuo et al. |
| 2010/0012884 A1 | * | 1/2010 | Nakamichi et al. ............. 252/70 |
| 2011/0129981 A1 | * | 6/2011 | Lim et al. ...................... 438/381 |

FOREIGN PATENT DOCUMENTS

| | | |
|---|---|---|
| KR | 10-2004-0074611 A | 8/2004 |
| KR | 10-2007-0108214 A | 11/2007 |
| KR | 10-2011-0006586 A | 1/2011 |
| KR | 10-2011-0062158 A | 6/2011 |
| KR | 10-2012-0000713 A | 1/2012 |
| KR | 10-2013-0028587 A | 3/2013 |

OTHER PUBLICATIONS

Search Report mailed Jan. 19, 2015 in corresponding Taiwanese Patent Application 102142903.

* cited by examiner

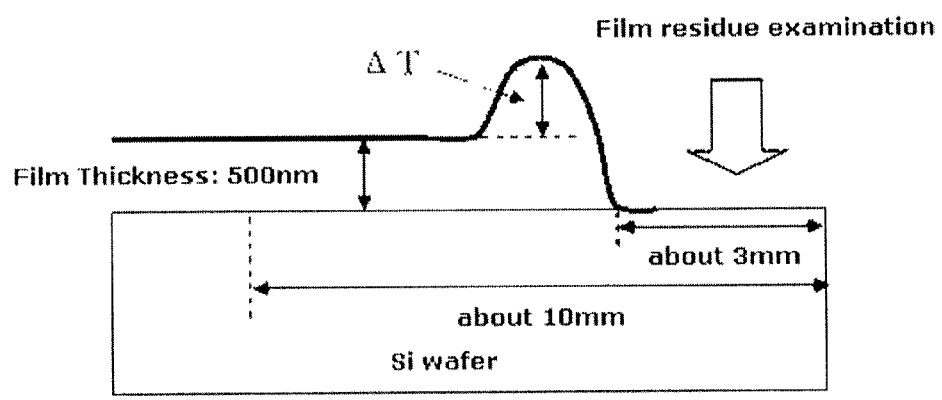

RINSE LIQUID FOR INSULATING FILM AND METHOD OF RINSING INSULATING FILM

CROSS-REFERENCE TO RELATED APPLICATION

Korean Patent Application No. 10-2013-0043079, filed on Apr. 18, 2013, in the Korean Intellectual Property Office, and entitled: "Rinse Liquid For Insulating Film and Method Of Rinsing Insulating Film," is incorporated by reference herein in its entirety.

BACKGROUND

1. Field

Embodiments relate to a rinse liquid for an insulation layer and a method of rinsing an insulation layer.

2. Description of the Related Art

Semiconductor devices may include features variously disposed on a substrate. During fabrication of a semiconductor device, certain features of the device may be formed by depositing, and subsequently removing, one or more layers of materials.

SUMMARY

Embodiments are directed to a rinse liquid for an insulation layer, the rinse liquid including a solvent represented by the following Chemical Formula 1:

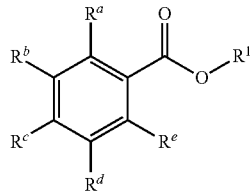

[Chemical Formula 1]

In the Chemical Formula 1, $R^1$ may be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, or a combination thereof, and $R^a$ to $R^e$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, a hydroxy group, a halogen, or a combination thereof.

The solvent represented by Chemical Formula 1 may be methyl benzoate, ethyl benzoate, propyl benzoate, isopropyl benzoate, butyl benzoate, benzyl benzoate, or a mixture thereof.

The solvent may include a single solvent represented by Chemical Formula 1 or a mixture of two or more solvents represented by Chemical Formula 1.

The rinse liquid may further include an auxiliary solvent having a boiling point of about 100° C. to about 300° C. at atmospheric pressure.

The auxiliary solvent may include an ether, a tetralin, an acetate, benzene, naphthalene, a ketone, a nitrile, a paraffin, a derivative thereof, or a mixture thereof.

The auxiliary solvent may include ethylene glycol diethylether, diethylene glycol dimethylether, diethylene glycol diethylether, diethylene glycol dibutylether, triethylene glycol dimethylether, ethyl tetralin, dimethyl tetralin, trimethyl tetralin, tetramethyl tetralin, benzyl acetate, 1,2-dimethylnaphthalene, 1-methylnaphthalene, acetophenone, adiponitrile, benzylethylether, butylbenzene, cyclohexylbenzene, dibenzylether, acenaphthalene, 1-naphthylacetonitrile, diphenylether, glycolether, a paraffin, or a mixture thereof.

The auxiliary solvent may include the paraffin, or a derivative thereof, having a boiling point of about 190° C. to about 220° C. at atmospheric pressure.

The auxiliary solvent may be included in an amount of more than about 0 wt % and less than or equal to about 99 wt % based on the total amount of the rinse liquid.

The rinse liquid may include about 50 or less particulates of greater than or equal to about 0.5 μm in 1 ml of the rinse liquid.

The rinse liquid may include about 200 or less particulates of greater than or equal to about 0.2 μm in 1 ml of the rinse liquid.

The rinse liquid may have a moisture content of about 150 ppm or less.

The insulation layer may include polysilazane, polysiloxazane, or a combination thereof.

Embodiments are also directed to a method of rinsing an insulation layer, the method including applying an insulation layer onto a substrate, and supplying a rinse liquid according to an embodiment to a front part, a rear part, an edge part, or a combination thereof, of the insulation layer.

The insulation layer may include polysilazane, polysiloxazane, or a combination thereof.

Embodiments are also directed to a method of fabricating a semiconductor device, the method including applying an insulation layer onto a semiconductor substrate, the insulation layer including polysilazane, polysiloxazane, or a combination thereof, and rinsing the insulation layer using a rinse liquid according to an embodiment.

The method may further include, after rinsing the insulation layer using the rinse liquid, heat treating the semiconductor substrate to convert the polysilazane, polysiloxazane, or combination thereof, to silica.

The insulation layer may form a dielectric layer of a capacitor.

The semiconductor device may include a DRAM, and the capacitor may be included in a memory cell of the DRAM.

BRIEF DESCRIPTION OF THE DRAWING

Features will become apparent to those of skill in the art by describing in detail exemplary embodiments with reference to the attached drawings in which:

FIG. 1 illustrates a schematic view showing a reference for evaluating an agglomeration degree at the end of insulation layers and a residual film of the insulation layers rinsed according to Examples 1 to 8.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figure, the dimensions of layers and regions may be exaggerated for clarity of illustration. Like reference numerals refer to like elements throughout.

As used herein, when a definition is not otherwise provided, the term 'substituted' refers to one substituted with at least one a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom in a compound.

As used herein, when a definition is not otherwise provided, the prefix 'hetero' may refer to one including 1 to 3 heteroatoms selected from N, O, S, and P.

Hereinafter, a rinse liquid for an insulation layer according to an example embodiment is described.

A rinse liquid for an insulation layer according to an example embodiment includes a solvent represented by the following Chemical Formula 1.

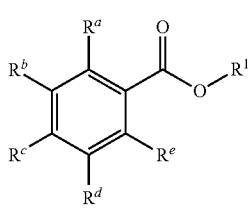

[Chemical Formula 1]

According to the present example embodiment, in the Chemical Formula 1, $R^1$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, or a combination thereof, and $R^a$ to $R^e$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, a hydroxy group, a halogen, or a combination thereof.

According to the present example embodiment, the solvent represented by the Chemical Formula 1 is a benzoate solvent. The solvent may not react with an insulation material, and therefore residues of an insulation layer. The solvent may not have an effect on characteristics of an insulation layer.

The solvent represented by the Chemical Formula 1 may include, for example, methyl benzoate, ethyl benzoate, propyl benzoate, isopropyl benzoate, butyl benzoate, benzyl benzoate, or a combination thereof, etc.

The solvent may include a single solvent or a mixture of two or more. The solvent may include a single solvent represented by Chemical Formula 1 or a mixture of two or more solvents represented by Chemical Formula 1.

The solvent may be included in an amount of about 1 to about 100 wt % based on the total amount of the rinse liquid.

The rinse liquid may further include an auxiliary solvent having a boiling point of about 100° C. to about 300° C. at atmospheric pressure. The rinse liquid including the auxiliary solvent having a boiling point within the range may help avoid a situation in which a residual film to be removed remains because the solvent is evaporated before the thin film is completely dissolved.

The auxiliary solvent may include, for example, ether, tetralin, acetate, benzene, naphthalene, ketone, nitrile, paraffin, a derivative thereof, or a combination thereof. In an implementation, the auxiliary solvent may include, for example, ethylene glycol diethylether, diethylene glycoldimethylether, diethylene glycol diethylether, diethylene glycol dibutylether, triethylene glycol dimethylether, ethyl tetralin, dimethyl tetralin, trimethyl tetralin, tetramethyl tetralin, benzyl acetate, 1,2-dimethylnaphthalene, 1-methylnaphthalene, acetophenone, adiponitrile, benzylethylether, butylbenzene, cyclohexylbenzene, dibenzylether, acenaphthalene, 1-naphthylacetonitrile, diphenylether, glycolether, a paraffin, or a combination thereof.

When the paraffin is used as the auxiliary solvent, the paraffin may be selected from aliphatic hydrocarbon, cyclic aliphatic hydrocarbon, or a combination thereof that have a boiling point of about 190° C. to about 220° C. at atmospheric pressure. The paraffin having a boiling point within the range may help avoid a situation in which a thin film becomes convex in a borderline with a substrate or is not clearly removed.

The auxiliary solvent may be included in an amount of more than about 0 wt % and less than or equal to about 99 wt % based on the total amount of the rinse liquid.

The rinse liquid may include about 50 or less particulates of greater than or equal to about 0.5 µm in 1 ml of the rinse liquid. When the number of such particulates is about 50 or less per ml of the rinse liquid, the particulates may be prevented from remaining on the surface of an insulation layer, which may help avoid deterioration of characteristics of the insulation layer or negative influences on a production yield and characteristics and of a device manufactured by using the insulation layer. In addition, when the number of the particulates is about 50 or less per ml of the rinse liquid, it may help reduce the use of filtration or distillation to decrease the number of the particulates. Similarly, the rinse liquid may include about 200 or less particulates of greater than or equal to about 0.2 μm in 1 ml of the rinse liquid.

The rinse liquid may have a moisture content of less than or equal to about 150 ppm. When the rinse liquid has a moisture content within the range, the rinse liquid may avoid or delay gelation of an insulation material such as polysilazane or polysiloxazane contacting the rinse liquid, prevent blockage of a waste fluid line in a spin coater, and more effectively remove the insulation material attached to a device. The rinse liquid may have a moisture content of less than or equal to 100 ppm.

The rinse liquid for an insulation layer according to an embodiment may be used for rinsing an insulation layer for an electronic device.

The electronic device may include, for example a semiconductor apparatus and a display device, and may be any device including an insulation layer.

The insulation layer may be a dielectric layer for a capacitor, an interlayer insulating layer, a planarization layer, a passivation film, a separation insulator, and the like in the electronic device.

The rinse liquid may be used, for example, on an insulation layer formed from polysilazane or polysiloxazane.

The polysilazane may include a moiety represented by the following Chemical Formula 2.

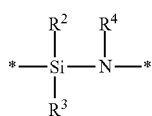

[Chemical Formula 2]

According to the present example embodiment, in the Chemical Formula 2, $R^2$ to $R^4$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, a hydroxy group, or a combination thereof.

According to the present example embodiment, the polysiloxazane includes a moiety represented by the Chemical Formula 2 and a moiety represented by the following Chemical Formula 3.

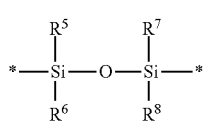

[Chemical Formula 3]

In the Chemical Formula 3, $R^5$ to $R^8$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, a hydroxy group, or a combination thereof.

The polysilazane may be, for example, perhydropolysilazane capped with hydrogen at the terminal end or polysilazane substituted with a functional group other than hydrogen for at least one of the $R^2$ to $R^4$, and the polysiloxazane may be perhydropolysiloxazane capped with hydrogen at the end or polysiloxazane substituted with a functional group other than hydrogen for at least one of the $R^5$ to $R^8$.

The polysilazane or the polysiloxazane may have an oxygen content ranging from about 0.2 to about 3 wt % based on the total weight. When the oxygen content is within the range, a stress due to a silicon-oxygen-silicon (Si—O—Si) bond in the structure may be alleviated, a contraction during heat treatment may be prevented, and a crack in a filler pattern may be prevented.

The polysilazane or the polysiloxazane may have, for example, a structure capped with hydrogen at the end (—SiH$_3$), and herein, a moiety represented by the —SiH$_3$ may be included in an amount of about 15 to about 35% based on the total weight of the Si—H bond. When the moiety is included within the range, a SiH$_3$ moiety may be prevented from being separated into SiH$_4$ while an oxidation reaction occurs during the heat treatment, and a crack in a filler pattern may be prevented.

The polysilazane or the polysiloxazane may have, for example, a weight average molecular weight of about 1,000 to about 30,0000. When the weight average molecular weight is within the range, components in a rinse liquid may be less evaporated during the heat treatment, and the rinse liquid may densely fill micro gaps having a size of less than or equal to 50 nm and resultantly, improve gap fill characteristics.

The polysilazane or the polysiloxazane may include, for example, a chlorine content of less than or equal to about 1 ppm.

Hereinafter, a method of rinsing an insulation layer according to an example embodiment is described.

A method of rinsing an insulation layer according to the present example embodiment includes applying an insulation layer onto a substrate and supplying the rinse liquid for an insulation layer according to an embodiment on the insulation layer.

The substrate may be, for example, a silicon wafer, a metal substrate, a glass substrate, and a polymer substrate, and a conductive layer, an insulation layer, and/or a semiconductor layer may singularly or in plural be laminated on the substrate.

The insulation layer may be the same as described above and may include, for example, polysilazane, polysiloxazane, or a combination thereof.

The rinse liquid for an insulation layer may be supplied on a front part, a rear part, an edge part of the insulation layer, or a combination thereof, and may be supplied once or sequentially. In addition, the rinse liquid may be supplied by, for example, spraying, dipping, spin-coating, slit-coating, and the like.

The supply of the rinse liquid on the insulation layer may effectively remove an insulation layer formed on a place where it is not supposed to be formed or a residue of insulation layer remaining on the side or rear of the substrates.

The rinse liquid may be used to rinse an insulation layer, and then, the insulation layer may be heat-treated.

The following Examples are provided in order to highlight characteristics of one or more embodiments, but it will be understood that the Examples are not to be construed as limiting the scope of the embodiments. Further, it will be understood that the embodiments are not limited to the particular details described in the Examples.

Synthesis of Polysilazane

Synthesis Example 1

A 2 L reactor equipped with an agitating device and a temperature controller was internally substituted with dry nitrogen. Subsequently, 1,500 g of dry pyridine was injected into the reactor and sufficiently mixed therewith, and then the reactor was kept warm at 20° C. Subsequently, 100 g of dichlorosilane was slowly injected thereinto over one hour. While the mixture was agitated, 70 g of ammonia was slowly injected thereinto over 3 hours. Subsequently, dry nitrogen was injected thereinto for 30 minutes, and the ammonia remaining in the reactor was removed.

The obtained white slurry-phased product was filtered with a TEFLON (tetrafluoroethylene) filter having 1 μm-sized pores under a dry nitrogen atmosphere, obtaining 1,000 g of a filtered solution. Subsequently, 1,000 g of dry xylene was added thereto, a solid content therein was adjusted into 20% by repetitively three times substituting the solvent from pyridine to xylene with a rotary evaporator, and the adjusted product was filtered with a TEFLON (tetrafluoroethylene) filter having 0.03 um-sized pores.

The obtained perhydropolysilazane had an oxygen content of 0.5%, $SiH_3/SiH$ (total) of 0.22, a weight average molecular weight of 4,000, and a chlorine content of 0.9 ppm.

The oxygen content was measured by using FlashEA 1112 (Thermo Fisher Scientific Inc.), the $SiH_3/SiH$ (total) was measured by using proton NM of 200 MHz: AC-200 (Bruker Co.), and the weight average molecular weight was measured by using GPC; HPLC Pump 1515, RI Detector 2414 (Waters Co.) and Column: KF801, KF802, KF803 (Shodex).

Rinse of Insulation Layer

Example 1

The perhydropolysilazane according to Synthesis Example 1 was added to 3 cc of a di-n-butylether solution, and the mixture was agitated, preparing a perhydropolysilazane solution. Subsequently, the perhydropolysilazane solution was spin-coated to form an insulation layer on a silicon wafer at 1500 rpm for 20 seconds. Subsequently, a rinse liquid including 100 wt % of methyl benzoate (ZOUPING MINGX-ING CHEMICAL Co., Ltd.) was sprayed at 10 ml/min for 5 seconds 3 mm up from the external circumference of the silicon wafer. Subsequently, the sprayed liquid was heat-treated at 150° C. for 3 minutes to form an insulation layer, after which the insulation layer was secondarily rinsed.

Example 2

An insulation layer was rinsed according to the same method as Example 1 except for using a rinse liquid including 100 wt % of ethyl benzoate (ZOUPING MINGXING CHEMICAL Co., Ltd.) instead of 100 wt % of the methyl benzoate.

Example 3

An insulation layer was rinsed according to the same method as Example 1 except for using a rinse liquid including 10 wt % of methyl benzoate and 90 wt % of paraffin (naphthru 200, Kodo Chemical) instead of 100 wt % of the methyl benzoate.

Example 4

An insulation layer was rinsed according to the same method as Example 1 except for using a rinse liquid including 20 wt % of methyl benzoate and 80 wt % of paraffin instead of 100 wt % of the methyl benzoate.

Example 5

An insulation layer was rinsed according to the same method as Example 1 except for using a rinse liquid including 30 wt % of methyl benzoate and 70 wt % of paraffin instead of 100 wt % of the methyl benzoate.

Example 6

An insulation layer was rinsed according to the same method as Example 1 except for using a rinse liquid including 10 wt % of ethyl benzoate and 90 wt % of paraffin instead of 100 wt % of the methyl benzoate.

Example 7

An insulation layer was rinsed according to the same method as Example 1 except for using a rinse liquid including 20 wt % of ethyl benzoate and 80 wt % of paraffin instead of 100 wt % of the methyl benzoate.

Example 8

An insulation layer was rinsed according to the same method as Example 1 except for using a rinse liquid including 30 wt % of ethyl benzoate and 70 wt % of paraffin instead of 100 wt % of the methyl benzoate.

Evaluation

The insulation layers rinsed according to Examples 1 to 8 were evaluated regarding agglomeration degree at the end, a residual film, and a moisture content of the rinse liquid.

FIG. 1 illustrates a schematic view showing a reference for the agglomeration degree at the end and the residual film of the insulation layers rinsed according to Examples 1 to 8.

The agglomeration degree at the end of an insulation layer was evaluated by measuring ΔT of FIG. 1 with reflection spectrophotography thickness measurer (ST-4000, K-MAC Technology Corp.) and an electron scanning microscope (S-4800 Type-2, Hitachi Ltd.), and the film residue was examined by using an optical microscope (LV 100D, Nikon Co.).

The moisture content of the rinse liquid was measured with a Karl Fisher moisture measurement device using an oxidation/reduction reaction.

The results are provided in Table 1.

TABLE 1

|  | ΔT (nm) | Residual film | Moisture content of the rinse liquid (ppm) |
| --- | --- | --- | --- |
| Example 1 | 10.49 | None | 116.5 |
| Example 2 | 4.64 | None | 114 |
| Example 3 | 176.59 | None | 117.3 |
| Example 4 | 56.31 | None | 107.1 |
| Example 5 | 46.92 | None | 118 |
| Example 6 | 90.75 | None | 112.2 |
| Example 7 | 77.44 | None | 117 |
| Example 8 | 74.98 | None | 109 |

Referring to Table 1, the insulation layers were effectively rinsed according to Examples 1 to 8 and showed almost no agglomeration and no residual film.

By way of summation and review, as semiconductor technology is increasingly developed, there is continuous research on forming highly-integrated and faster semiconductor memory cells that have improved performance and integrate smaller semiconductor chips. Among these semiconductor memory cells, e.g., DRAM (dynamic random access memory) may be used. The DRAM is capable of freely inputting and outputting information, and may realize large capacity.

The DRAM may include, e.g., a plurality of unit cells including a MOS transistor (metal-oxide-semiconductor transistor) and a capacitor. The capacitor may include two electrodes and a dielectric layer disposed therebetween. The capacitor may have various capacities depending on, e.g., a dielectric constant, a thickness of the dielectric layer, an area of the electrodes.

As a size of a semiconductor chip is reduced, the size of the capacitor therein may also be reduced. However, a smaller capacitor may be required to maintain sufficient storage capacity. The capacitor may accomplish bigger capacity by, e.g., increasing the vertical area while decreasing the horizontal area to increase overall active area. An insulation material having gap fill characteristics to fill narrow gaps between patterns without an empty space may be used in such a case.

The insulation material may include silica by applying a silicon-nitrogen-containing compound such as polysilazane and curing it. The silica may be used as, for example, a dielectric layer for a capacitor, an interlayer insulating layer, a planarization layer, a passivation film, a separation insulator, and the like in an electronic device such as a semiconductor apparatus or a display device.

When the silicon-nitrogen-containing compound such as polysilazane is used to form a thin film on a substrate, the silicon-nitrogen-containing compound formed where the thin film is not supposed to be formed, or its residue remaining on the side or rear of the substrate, may be removed. For this, a rinse liquid for an insulation layer may be used.

As described above, an embodiment provides a rinse liquid for an insulation layer. The rinse liquid may effectively rinse residues of an insulation layer without having an effect on characteristics of an insulation layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A rinse liquid for an insulation layer, the rinse liquid comprising:
   a solvent represented by the following Chemical Formula 1; and
   an auxiliary solvent, the auxiliary solvent including paraffin, or a derivative thereof, having a boiling point of about 190° C. to about 220° C. at atmospheric pressure,

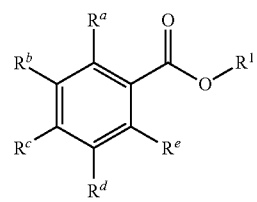

[Chemical Formula 1]

wherein, in the Chemical Formula 1,
$R^1$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, or a combination thereof, and
$R^a$ to $R^e$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C5 to C30 heteroaryl group, a substituted or unsubstituted C2 to C30 alkenyl group, a substituted or unsubstituted C2 to C30 alkynyl group, a substituted or unsubstituted alkoxy group, a substituted or unsubstituted carbonyl group, a hydroxy group, a halogen, or a combination thereof.

2. The rinse liquid as claimed in claim 1, wherein the solvent represented by Chemical Formula 1 is methyl benzoate, ethyl benzoate, propyl benzoate, isopropyl benzoate, butyl benzoate, benzyl benzoate, or a mixture thereof.

3. The rinse liquid as claimed in claim 1, wherein the solvent includes a single solvent represented by Chemical Formula 1 or a mixture of two or more solvents represented by Chemical Formula 1.

4. The rinse liquid as claimed in claim 1, wherein the rinse liquid comprises about 50 or less particulates of greater than or equal to about 0.5 μm in 1 ml of the rinse liquid.

5. The rinse liquid as claimed in claim 1, wherein the rinse liquid comprises about 200 or less particulates of greater than or equal to about 0.2 μm in 1 ml of the rinse liquid.

6. The rinse liquid as claimed in claim 1, wherein the rinse liquid has a moisture content of about 150 ppm or less.

7. A method of rinsing an insulation layer, the method comprising:
   applying an insulation layer onto a substrate; and
   supplying the rinse liquid as claimed in claim 1 to a front part, a rear part, an edge part, or a combination thereof, of the insulation layer.

8. A method of fabricating a semiconductor device, the method comprising:
   applying an insulation layer onto a semiconductor substrate, the insulation layer including polysilazane, polysiloxazane, or a combination thereof; and
   rinsing the insulation layer using the rinse liquid as claimed in claim 1.

9. The method as claimed in claim 8, further comprising, after rinsing the insulation layer using the rinse liquid, heat treating the semiconductor substrate to convert the polysilazane, polysiloxazane, or combination thereof, to silica.

10. The method as claimed in claim 8, wherein the insulation layer forms a dielectric layer of a capacitor.

11. The method as claimed in claim 10, wherein the semiconductor device includes a DRAM, and the capacitor is included in a memory cell of the DRAM.

\* \* \* \* \*